United States Patent [19]
Kruangam

[11] Patent Number: 5,656,823
[45] Date of Patent: Aug. 12, 1997

[54] AMORPHOUS SEMICONDUCTOR THIN FILM LIGHT EMITTING DIODE

[75] Inventor: Dusit Kruangam, Bangkok, Thailand

[73] Assignee: Chulalongkorn University, Thailand

[21] Appl. No.: 414,738

[22] Filed: Mar. 31, 1995

[30] Foreign Application Priority Data

Mar. 31, 1994 [AU] Australia ................................. PM4832

[51] Int. Cl.$^6$ ..................................................... H01L 29/04
[52] U.S. Cl. ................................. 257/59; 257/72; 257/98; 257/99; 257/103
[58] Field of Search ................................ 257/52, 59, 72, 257/91, 98, 103, 53, 57, 99

[56] References Cited

U.S. PATENT DOCUMENTS 4,766,471  8/1988  Ovshinsky et al. ......................... 257/57
5,220,183  6/1993  Taniguchi et al. .......................... 257/91

*Primary Examiner*—Minhloan Tran
*Attorney, Agent, or Firm*—Dorn, McEachran, Jambor & Keating; Vangelis Economou

[57] ABSTRACT

An amorphous semiconductor thin film light emitting diode comprising of a first electrode metal sheet substrate, amorphous semiconductor layers and a second optically transparent electrode. The first electrode metal sheet substrate acts as the support of the electrode and provides ruggedness, good thermal stability and dissipation of heat, good reflectance and flexibility. The device may further include electrically insulating layers which cause a pattern of light to be emitted by the diode, by controlling the passage of current through areas of the amorphous semiconductor layers.

35 Claims, 1 Drawing Sheet

AMORPHOUS SEMICONDUCTOR THIN FILM LIGHT EMITTING DIODE

An amorphous semiconductor thin film light emitting diode with a metal substrate, the diode adapted to include layers of material that can effect varying patterns of emitted light.

FIELD OF THE INVENTION

The invention relates to an amorphous semiconductor thin film light emitting diode which is an electronic device that can emit light when it is biased in a forward bias condition. The emitted light ranges from the infrared to the visible regions of the electromagnetic spectrum. The colours of the visible light are, for example, red, orange, yellow, green, blue and white.

This innovative thin film light emitting diode commonly known as a TFLED can emit light from the surface of any size, from small to large areas. Therefore, it can be used for such things as a flat panel display, television, computer monitor, advertisement, and monitor display in electronic equipment. The TFLED when used as a television has advantages over the conventional cathode ray tube (CRT) that is now commonly used. It can be produced in a mass production scale, and since it uses mainly silicon, an abundant and inexpensive material, the cost of TFLED is low. Since the TFLED is operated at a low voltage, less than 20 volts, and it does not comprise any vacuum tubes, there is no danger of high voltage shock or burst from vacuum tubes. Moreover, a display made from the thin film LED may be used as a lightweight and smart wall-type display.

DESCRIPTION OF THE RELATED ART

At present there are a number of different types of technologies used for displays that have already been commercialised in the market. However, most of these still have some disadvantages. The following is a listing of some of these technologies used for displays and their limitations and/or disadvantages.

The Cathode Ray Tube (CRT) is made of a glass vacuum tube, which is quite bright, with good precision. However, it needs a relatively high operating voltage, as high as several ten thousand volts, and it is in constant danger of implosion.

The Liquid Crystal Display (LCD) uses a low operating voltage, but its contrast and viewing angle are of poor quality and generally not very good.

The conventional Light Emitting Diode (LED) currently available is made of expensive and small area crystalline semiconductors.

Electroluminescence (EL) needs a relatively high operating voltage, more than 100 volts.

The needs of flat panel displays increases year by year.

This invention is intended to minimize or overcome some of the above problems or at least provide the public with a useful alternative. A TFLED is made of low-cost amorphous semiconductor materials. It is possible to fabricate a TFLED as a large area display.

SUMMARY OF THE INVENTION

Therefore in one form of the invention there is proposed an amorphous semiconductor thin film light emitting diode comprising:

a first electrode;

a plurality of thin amorphous semiconductor layers capable of emitting light in response to an electric stimuli;

a second electrode:

the plurality of thin amorphous semiconductor layers being arranged in a sandwich type arrangement in between the first and second electrode so as to enable an electric current to pass between the first and second electrodes through the plurality of thin amorphous semiconductor layers:

the first electrode fabricated from metal:

the second electrode fabricated from an optically transparent electrical conducting material.

In a further form of the invention there is proposed an amorphous semiconductor thin film light emitting diode comprising:

a metal substrate;

a plurality of thin amorphous semiconductor layers positioned on said metal substrate and capable of emitting light in response to an electric stimuli;

an electrode layer positioned on the plurality of amorphous semiconductor layers;

the metal substrate, plurality of thin amorphous semiconductor layers and electrode layer being in a sandwich type arrangement, the metal substrate supporting the semiconductor layers and the electrode layer.

In a yet further form of the invention there is proposed an amorphous semiconductor thin film light emitting diode adapted to emit a pattern of light comprising:

a first electrode metal substrate;

a plurality of amorphous semiconductor thin film layers positioned on said first electrode metal substrate and capable of emitting light in response to an electric stimuli;

a second electrode layer positioned on the said plurality of amorphous semiconductor thin film layers, said second electrode being optically transparent to the light emitted by the amorphous semiconductor thin film layers; and a pattern deposited onto the second electrode.

In a still further form of the invention there is proposed an amorphous semiconductor thin film light emitting diode adapted to emit a pattern of light comprising:

a first electrode metal substrate;

at least one insulator film deposited to cover a portion of the surface of the first electrode metal substrate;

a plurality of thin film amorphous semiconductor layers deposited onto the first electrode metal substrate which has no overlying insulator film and on top of the at least one insulator film overlying the first electrode metal substrate and adapted to emit light in response to an electric stimuli;

a second electrode deposited onto the plurality of thin film amorphous semiconductor layers said second electrode being optically transparent to the light emitted by the diode and being electrically conductive;

said first electrode metal substrate, supporting the semiconductor layers and the second electrode; and said at least one insulating film being non-electrically conductive so that when the diode is electrically stimulated by an electric current fed into the diode in between the first and second electrodes, substantially no current flows through the at least one insulating layer and thus across the amorphous semiconductor layers deposited on top of the at least one insulating layer resulting in only areas of the diode containing no insulating film emitting light, the emitted light therefore having a pattern.

In a still another form of the invention there is proposed an amorphous semiconductor thin film light emitting diode adapted to emit a pattern of light comprising:

a first electrode metal substrate;

a plurality of thin film amorphous semiconductor layers deposited onto the first electrode metal substrate and adapted to emit light in response to an electric stimuli;

at least one insulator film deposited to cover a portion of the surface of the plurality of the thin film amorphous semiconductor layers;

a second electrode deposited onto the plurality of thin film amorphous semiconductor layers which have no overlying insulator film and on top of the at least one insulator film overlying the thin film amorphous semiconductor layers;

said second electrode being a layer of material optically transparent to the light emitted by the diode;

said first electrode metal substrate supporting the semiconductor layers and second electrode;

said at least one insulating film being non-electrically conductive so that when the diode is electrically stimulated by an electric current fed into the diode in between the first and second electrodes substantially no current flows through the at least one insulating layer and thus across the amorphous semiconductor layers with at least one insulating layer deposited on top resulting in only areas of the diode containing no insulating film emitting light, the emitted light therefore having a pattern.

BRIEF DESCRIPTION OF THE DRAWINGS

To further aid in understanding of this invention reference is made to the following figures in which.

DESCRIPTION OF THE PREFERRED EMBODIMENTS

Turning now to the drawings in detail they describe embodiments of the invention which also illustrate advantageous features which can be obtained in accordance with the invention.

Figure 1:
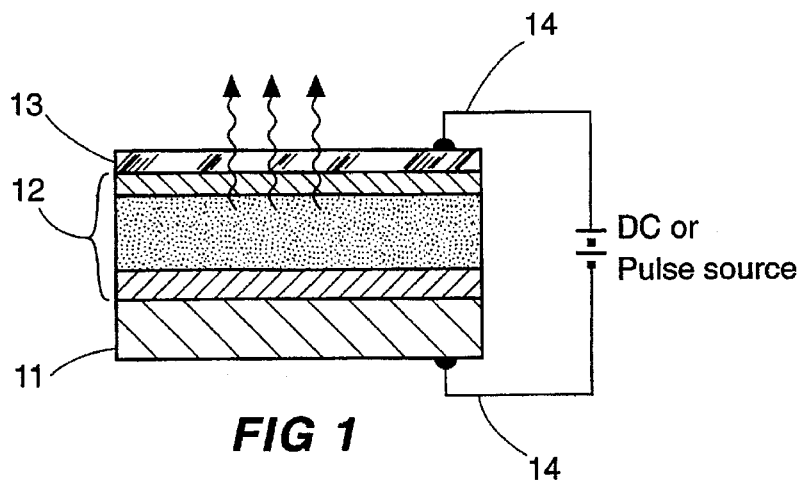
FIG. 1 is a cross-sectional view of the amorphous semiconductor thin film light emitting diode.

FIG. 1 is a cross section view of the amorphous semiconductor thin film light emitting diode. Amorphous semiconductor materials are used as the main materials and metal sheets as a substrate. The detailed descriptions of the numbers indicated in the figure are as follows:

11 is a metal substrate, stainless steel, although other metals such as copper, aluminium, bronze, zinc, nickel may be used, 12 are p-i-n junctions of thin film amorphous semiconductor materials, chosen from the group of amorphous silicon, amorphous silicon carbide, amorphous silicon nitride, amorphous silicon oxide, or the combination of these materials, which may result in for example amorphous silicon carbon nitride, although other suitable materials maybe used, 13 is an optically transparent and electrically conductive thin film electrode materials, chosen from the group consisting of, but not limited to tin oxide ($SnO_2$), indium tin oxide (ITO) or zinc oxide or the combination of these materials, and 14 is an electrically conductive electrode.

Figure 2:
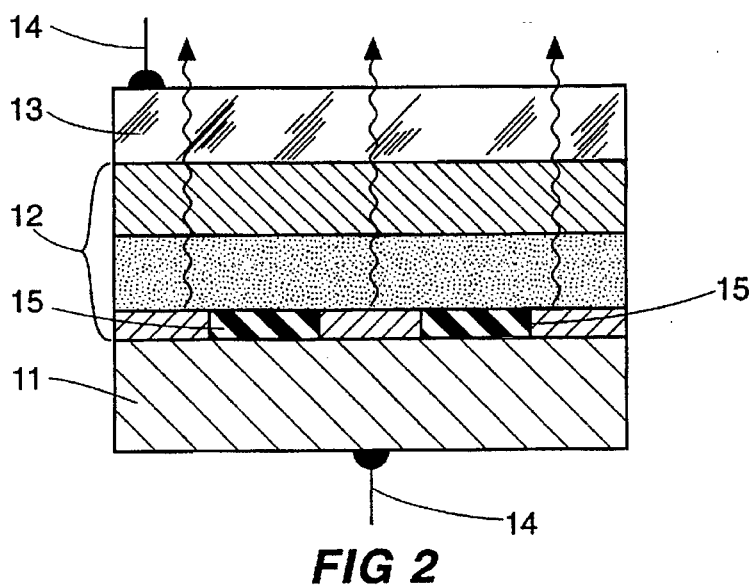
FIG. 2 is a cross-sectional view of the thin film light emitting diode as in FIG. 1 in which an insulating layer is inserted between the substrate and the amorphous semiconductor layer.
Figure 3:
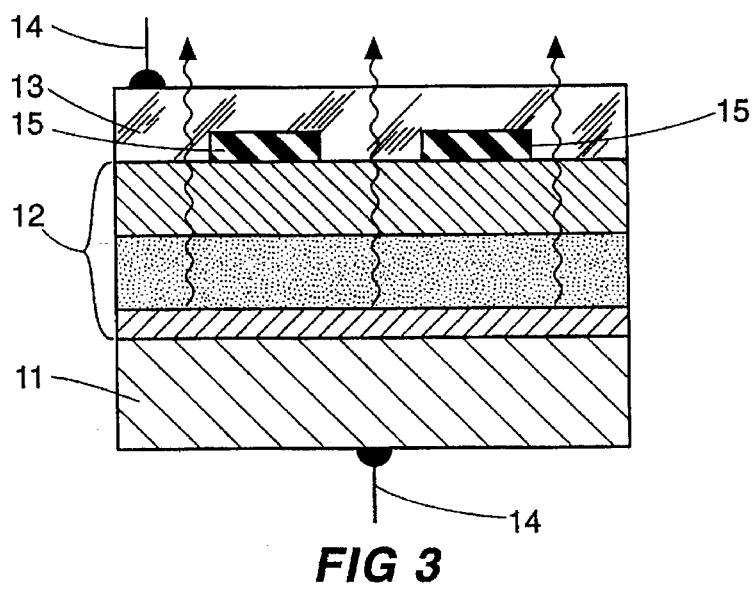
FIG. 3 is a cross-sectional view of the thin film light emitting diode as in the previous figures but with an insulating layer being inserted between the amorphous semiconductor layers and the top transparent electrode.

FIGS. 2 and 3 are a cross-sectioned view of the TFLED in which an insulating layer 15 is inserted in between substrate 11 and amorphous semiconductor layers 12, and between amorphous semiconductor layers 12 and top transparent electrode 13, respectively. In this structure, the light will be emitted from the portions that do not contain insulating layer 15.

The insulating layer 15 is an electrically insulating thin film material, such as but not limited to silicon oxide ($SiO_2$, SiO), yttrerium oxide ($Y_2O_3$), lead titanium oxide ($PbTiO_3$), silicon nitride (SiN).

It is to be understood though that the insulating layer may reside within the amorphous semiconductor layers and not on top of either the metal substrate or below the top electrode layer. The function of this layer is to stop current flowing through the semiconductor layers which are therefore not stimulated in those areas with no current flowing and thus produce no light.

The amorphous semiconductor TFLED has a basic structure as shown in FIGS. 1, 2 and 3. A sheet of metal material 11 is used as a substrate. After cleaning the substrate, amorphous semiconduction materials 12 having p-i-n or n-i-p junction configurations are deposited onto the substrate by, for example, a glow discharge plasma chemical vapour deposition (CVD), followed by the deposition of the top transparent electrode 13.

A feature of the arrangement is the use of a metal sheet as a substrate for the thin film light emitting diode whereas conventioned techniques have used a glass substrate. Advantages of using a metal sheet substrate are as follows:

(a) A metal sheet is strong and is not fragile.

(b) During the injection of electrical current into the thin film light emitting diode, heat may cause a glass substrate to crack, while metal sheet will not crack.

(c) The thermal conductivity of metal is higher than that of glass. Therefore, the heat dissipation from the thin film light emitting diode deposited on metal substrate should be better than in the case in which a glass substrate is used. Therefore, the external quantum efficiency of luminescence for the device having a metal sheet as a substrate should be better than the case of having glass as a substrate. This leads to a brighter and more stable thin film light emitting diode.

(d) The thin film light emitting diode having metal sheet as a substrate can be easily connected to a cooler or heat dissipater, for example thermo-electric cooler, so that the temperature of the thin film light emitting diode during operation can be controlled. Controlling the device temperature at low temperature will lead to a brighter emission from the device.

(e) The surface of smooth metal sheet may be lustrous like a mirror surface. The mirror surface will thus act as a good reflector of the emitted light, so that the light will be more efficiently directed out of the device, leading to a brighter device.

(f) Metal sheet is normally flexible. Therefore, a new type of flexible thin film light emitting diode flat panel display can be realised.

(g) Metal sheet substrate can also act as an electrode for the thin film light emitting diode by itself. This can lead to a reduction in the cost and time for the production process.

From the abovementioned reasons (a) to (g), the amorphous semiconductor thin film light emitting diode that is fabricated onto a metal sheet substrate will thus have a better performance, for example, brighter, more stable, more flexible, and longer life time than that fabricated onto a conventional glass substrate.

In the detailed designs of the said amorphous thin film light emitting diode having a metal sheet as a substrate, the metal substrate should have the following properties:

(a) The melting point should be higher than 300° C.

(b) The surface should be smooth.

(c) The surface should be well lustrous and posses a good optical reflectivity in the wavelength region responding to the wavelength of the emitted light.

d) The metal should be stable even when it is put into a plasma CVD reactor. It should be strong enough to withstand the sputtering by a plasma of gases used for the fabrication of amorphous semiconductors, for example, hydrogen, silane, methane, ethylene, and so on.

e) The atomic diffusion constant of the metal into the amorphous semiconductor regions should be very small.

f) The thickness of the metal sheet should be appropriately very thin, otherwise the device will be easily damaged. It should also be not too thick or the device will be heavy and the material cost will be increased. The normal thickness of the metal sheet preferred is from, for example, 0.5 millimeter to 1 millimeter.

g) The metal sheet should have a good electrical conductivity and also has a good ohmic contact to the amorphous semiconductor layers.

The suitable materials for the good substrate may be, for example, stainless steel (SUS), copper, aluminium, bronze, zinc.

The thin film emitting diode can also be fabricated to produce various patterns in the emitted light.

The fabrication of the thin film light emitting diode that can emit a desired pattern of light can be performed by using but not limited to the following techniques:

(h) The emitting pattern can be realised by depositing the front top transparent electrode (13) having the desired pattern.

(i) By inserting an insulating thin film (15) in between the metal substrate (11) and amorphous semiconductor layers (12), or inserting the insulating thin film (15) in between amorphous semiconductor layers (12) and the top transparent electrode (13) as shown in FIGS. 2 and 3. The current cannot flow across the insulating layer region, but the current can flow across the device where there is no insulating layer. Therefore, by forming a pattern in the insulating layer, the thin film light emitting diode will emit light having the desired pattern.

I claim:

1. An amorphous semiconductor thin film light emitting diode comprising:

a first metal electrode;

a plurality of thin amorphous semiconductor layers capable of emitting light in response to an electric stimuli;

a second electrode fabricated from an optically transparent electrically conducting material;

the plurality of thin amorphous semiconductor layers being arranged in a sandwich type arrangement in between the first and second electrodes through the plurality of thin amorphous semiconductor layers, and said first metal electrode supporting the thin amorphous semiconductor layers and the second electrode, and thereby comprising a substrate as well as an electrode.

2. An amorphous semiconductor thin film light emitting diode as in claim 1 wherein the first metal electrode is in form of a sheet having good electrical and thermal conductivities and adapted to be a lustrous, substantially smooth surface and of light weight.

3. An amorphous semiconductor thin film light emitting diode as in claim 1 wherein the plurality of thin amorphous semiconductor layers have p-i-n junction configuration.

4. An amorphous semiconductor thin film light emitting diode as in claim 1 wherein the plurality of thin amorphous semiconductor layers have n-i-p junction configurations.

5. An amorphous semiconductor thin film light emitting diode as in claim 1 wherein the second electrode is a layer of material substantially optically transparent to electromagnetic radiation emitted by the thin film light emitting diode.

6. An amorphous semiconductor thin film light emitting diode comprising:

a metal substrate;

a plurality of thin amorphous semiconductor layers positioned on said metal substrate and capable of emitting light in response to an electric stimuli;

an electrode layer positioned on the plurality of amorphous semiconductor layers;

the metal substrate, plurality of thin amorphous semiconductor layers and electrode layer being in a sandwich type arrangement, the metal substrate supporting the semiconductor layers and the electrode layer.

7. An amorphous semiconductor thin film light emitting diode as in claim 6 wherein the metal substrate is in form of a sheet having good electrical and thermal conductivities and adapted to be a lustrous, substantially smooth surface and of light weight.

8. An amorphous semiconductor thin film light emitting diode as in claim 7 wherein the metal substrate comprises a material having at least one element of the group including but not limited to stainless steel, copper, aluminum, bronze, zinc, nickel, the choice of material determined by the properties desired these including longevity, ruggedness, low cost and good reflectivity.

9. An amorphous semiconductor thin film light emitting diode as in claim 6 wherein the plurality of thin amorphous semiconductor layers have p-i-n junction configuration.

10. An amorphous semiconductor thin film light emitting diode as in claim 6 wherein the plurality of thin amorphous semiconductor layers have n-i-p junction configurations.

11. An amorphous semiconductor thin film light emitting diode as in claim 6 wherein the electrode is a layer of material substantially optically transparent to electromagnetic radiation emitted by the thin film light emitting diode.

12. An amorphous semiconductor thin film light emitting diode as in claim 11 wherein the optically transparent and electrically conductive second electrode is selected from but not limited to the group including tin oxide, indium tin oxide, zinc oxide, indium oxide, zirconium oxide.

13. An amorphous semiconductor thin film light emitting diode as in claim 6 wherein the plurality of thin film amorphous semiconductor layers are fabricated from a material comprising at least one of amorphous silicon, amorphous silicon carbide, amorphous silicon nitride, amorphous silicon oxide.

14. An amorphous semiconductor thin film light emitting diode adapted to emit a pattern of light comprising:

a first electrode metal substrate;

at least one insulator film deposited to cover a portion of the surface of the first electrode metal substrate;

a plurality of thin film amorphous semiconductor layers deposited onto the first electrode metal substrate which has no overlying insulator film and on top of the at least one insulator film overlying the first electrode metal substrate and adapted to emit light in response to an electric stimuli;

a second electrode deposited onto the plurality of thin film amorphous semiconductor layers said second electrode being optically transparent to the light emitted by the diode and being electrically conductive;

said first electrode metal substrate supporting the semiconductor layers and the second electrode; and said at least one insulating film being non-electrically conductive so that when the diode is electrically stimulated by an electric current fed into the diode in between the first and second electrodes substantially no current flows through the at least one insulating layer and thus across the amorphous semiconductor layers deposited on top of the at least one insulating layer resulting in only areas of the diode containing no insulating film emitting light, the emitted light therefore having a pattern.

15. An amorphous semiconductor thin film light emitting diode as in claim 14 wherein the first electrode metal substrate is in form of a sheet with good electrical and thermal conductivities, and adapted to have a lustrous, be substantially smooth surface and be of light weight.

16. An amorphous semiconductor thin film light emitting diode as in claim 14 wherein the plurality of thin film amorphous semiconductor layers have p-i-n junction configuration.

17. An amorphous semiconductor thin film light emitting diode as in claim 16 wherein the metal substrate comprises a material having at least one element of the group including but not limited to stainless steel, copper, aluminum, bronze, zinc, nickel, the choice of material determined by the properties desired these including longevity, ruggedness, low cost and good reflectivity.

18. An amorphous semiconductor thin film light emitting diode as in claim 14 wherein the plurality of thin film amorphous semiconductor layers have n-i-p junction configuration.

19. An amorphous semiconductor thin film light emitting diode as in claim 14 wherein the plurality of thin film amorphous semiconductor layers are fabricated from a material comprising at least one of amorphous silicon, amorphous silicon carbide, amorphous silicon nitride, amorphous silicon oxide.

20. An amorphous semiconductor thin film light emitting diode as in claim 14 wherein the optically transparent and electrically conductive second electrode is selected from but not limited to the group including tin oxide, indium tin oxide, zinc oxide, indium oxide, zirconium oxide.

21. An amorphous semiconductor thin film light emitting diode as in claim 14 where the at least one insulator film may be deposited within the plurality of thin film amorphous semiconductor layers.

22. An amorphous semiconductor thin film light emitting diode as in claim 14 wherein the at least one insulator film is fabricated from the group including but not limited to silicon oxide, yttrerium oxide, lead titanium oxide, silicon nitride.

23. An amorphous semiconductor thin film light emitting diode adapted to emit a pattern of light comprising:

a first electrode metal substrate;

a plurality of thin film amorphous semiconductor layers deposited onto the first electrode metal substrate and adapted to emit light in response to an electric stimuli;

at least one insulator film deposited to cover a portion of the surface of the plurality of the thin film amorphous semiconductor layers;

a second electrode deposited onto the plurality of thin film amorphous semiconductor layers which have no overlying insulator film and on top of the at least one insulator film overlying the thin film amorphous semiconductor layers;

said second electrode being a layer of material optically transparent to the light emitted by the diode;

said first electrode metal substrate supporting the semiconductor layers and second electrode;

said at least one insulating film being non-electrically conductive so that when the diode is electrically stimulated by an electric current fed into the diode in between the first and second electrodes substantially no current flows through the at least one insulating layer and thus across the amorphous semiconductor layers with at least one insulating layer deposited on top resulting in only areas of the diode containing no insulating film emitting light, the emitted light therefore having a pattern.

24. An amorphous semiconductor thin film light emitting diode as in claim 23 wherein the first electrode metal substrate is in form of a sheet with good electrical and thermal conductivities, and adapted to be a lustrous, substantially smooth surface and light weight.

25. An amorphous semiconductor thin film light emitting diode as in claim 24 wherein the metal substrate comprises a material having at least one element of the group including but not limited to stainless steel, cooper, aluminum, bronze, zinc, nickel, the choice of material determined by the properties desired these including longevity, ruggedness, low cost and good reflectivity.

26. An amorphous semiconductor thin film light emitting diode as in claim 23 wherein the plurality of thin film amorphous semiconductor layers have p-i-n junction configuration.

27. An amorphous semiconductor thin film light emitting diode as in claim 23 wherein the plurality of thin film amorphous semiconductor layers have n-i-p junction configuration.

28. An amorphous semiconductor thin film light emitting diode as in claim 23 wherein the plurality of thin film amorphous semiconductor layers are fabricated from a material comprising at least one of amorphous silicon, amorphous silicon carbide, amorphous silicon nitride, amorphous silicon oxide.

29. An amorphous semiconductor thin film light emitting diode as in claim 23 wherein the optically transparent and electrically conductive second electrode is selected from but not limited to the group including tin oxide, indium tin oxide, zinc oxide, indium oxide, zirconium oxide.

30. An amorphous semiconductor thin film light emitting diode as in claim 23 where the at least one insulator film may be deposited within the plurality of thin film amorphous semiconductor layers.

31. An amorphous semiconductor thin film light emitting diode as in claim 23 wherein the at least one insulator film is fabricated from the group including but not limited to silicon oxide, yttrerium oxide, lead titanium oxide, silicon nitride.

32. An amorphous semiconductor thin film light emitting diode comprising:

a metal substrate for supporting the thin film light emitting diode and for providing a first electrode to said diode;

a plurality of thin amorphous semiconductor layers deposited on said substrate, said amorphous semiconductor layers comprising a diode capable of emitting light in response to electric stimuli;

an optically transparent, electrically conducting second electrode;

the plurality of thin amorphous semiconductor layers being arranged in a sandwich type arrangement between said first and second electrodes, whereby electric stimuli passed between said first and second electrodes causes said amorphous semiconductor layers comprising a diode to emit light which is then transmitted from said diode and through said optically transparent, electrically conducting second electrode.

33. An amorphous semiconductor thin film light emitting diode as in claim 32 wherein the first electrode metal substrate further comprises metal having at least one element taken from the group comprising stainless steel, cooper, aluminum, bronze, zinc, nickel, the choice of metal being determined by predetermined metal properties such as longevity, ruggedness, low cost and good reflectivity.

34. An amorphous semiconductor thin film light emitting diode as in claim 32 wherein said plurality of thin film amorphous semiconductor layers further comprise at least one element taken form the group comprising amorphous silicon, amorphous silicon carbide, amorphous silicon nitride and amorphous silicon oxide.

35. An amorphous semiconductor thin film light emitting diode as in claim 32, wherein said plurality of thin film amorphous semiconductor layers further comprise at least one film layer that includes portions that are insulating and non-electrically conductive such that when the diode is electrically stimulated by an electric current fed into the diode in between the first and second electrodes, substantially no current flows through the at least one insulating layer and thus across the amorphous semiconductor layers deposited on top of the at least one insulating layer resulting in only areas of the diode containing no insulating film to emit light, thereby the light emitted from the diode having a pattern.

* * * * *